(12) United States Patent
Kim

(10) Patent No.: US 6,475,913 B1
(45) Date of Patent: Nov. 5, 2002

(54) METHOD FOR FORMING DAMASCENE TYPE OF METAL WIRES IN SEMICONDUCTOR DEVICES

(75) Inventor: Heon-Do Kim, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/604,621

(22) Filed: Jun. 27, 2000

(30) Foreign Application Priority Data

Jun. 24, 1999 (KR) .......................................... 99-23977

(51) Int. Cl.⁷ .............................................. H01L 21/44
(52) U.S. Cl. ...................... 438/687; 438/618; 438/622; 438/629; 438/637; 438/642; 438/652
(58) Field of Search ................. 438/618, 622, 438/625–629, 631, 633, 637–645, 652–654, 674, 677–680, 687, 675

(56) References Cited

U.S. PATENT DOCUMENTS

| | | |
|---|---|---|
| 5,576,052 A | 11/1996 | Arledge et al. |
| 5,851,367 A | 12/1998 | Nguyen et al. |
| 5,891,513 A | 4/1999 | Dubin et al. |
| 5,939,788 A | 8/1999 | Mc'Teer |
| 6,077,780 A * | 6/2000 | Dubin ........................ 438/687 |
| 6,136,707 A * | 10/2000 | Cohen ........................ 438/687 |
| 6,261,954 B1 * | 7/2001 | Ho et al. ..................... 438/687 |

* cited by examiner

*Primary Examiner*—Matthew Smith
*Assistant Examiner*—Craig P. Lytle
(74) *Attorney, Agent, or Firm*—Blakely Sokoloff Taylor & Zafman

(57) ABSTRACT

There is provided a method for forming damascene type of metal wire in a semiconductor device, which can improve the step coverage of seed layer in the metal wire process using copper and can also improve the orientation and binding force of the electric plated copper layer. The method includes the steps of depositing a copper thin layer by physical vapor deposition within damascene type of contact hole and trench for line, forming a seed layer by chemical vapor deposition, and then depositing copper for main wire by electric plating, wherein the copper layer deposited by physical vapor deposition can improve the orientation and the binding force of copper seed layer deposited later by Cu CVD. The step coverage of the seed layer can be also improved due to chemical vapor deposition.

15 Claims, 3 Drawing Sheets

METHOD FOR FORMING DAMASCENE TYPE OF METAL WIRES IN SEMICONDUCTOR DEVICES

FIELD OF THE INVENTION

The present invention relates to a method for forming metal wire in semiconductor devices; and, more particularly, to a method for forming damascene type of copper wire in semiconductor devices.

DESCRIPTION OF THE PRIOR ART

With high integration of semiconductor devices, the reduction of design rule has been accelerated. So, the pitch of metal wire has been decreased. When the conventional metal wire process is applied to the formation of metal wire with high aspect ratio, it is difficult to obtain satisfactory results such as uniformity of critical dimension of metal wire, line etch profile and etch selectivity of photoresist. To improve the results, hard mask should be used. However, this results in the increase of fabrication cost and delay of device development.

Meanwhile, the damascene type of metal wire process is promising as a technique to solve the above-described problems and it is hopeful of applying to the fabrication of future generation ultra high-integrated devices.

The damascene type of metal wire process conventionally includes the steps of forming a trench for line and contact hole through an interlayer insulating layer, depositing barrier metal and metal wire, and removing the barrier metal and metal wire on the interlayer insulating layer by using chemical mechanical planarization (CMP).

In case of using copper as metal wire, the metal wire of copper has been conventionally formed by physical vapor deposition and electric plating method. Namely, the seed layer has been formed by physical vapor deposition and the trench for line and contact hole have been buried with copper by electric plating.

However, the step coverage of the seed layer deposited by physical vapor deposition is poor in this conventional method, so that voids may be formed within the contact hole or trench at the time of depositing copper by electric plating. The voids are very harmful in reliability of metal wire.

In consideration of this problem, forming the seed layer by chemical vapor deposition is to improve the step coverage to some extent. Nonetheless, there remains still a problem that the copper layer may be striped off because the orientation of copper layer deposited later by electric plating, its binding with the seed layer and the lower conductive layer are so poor.

SUMMARY OF THE INVENTION

It is, therefore, an object of the present invention to provide a method for forming damascene type of metal wire in a semiconductor device, which can improve the step coverage of seed layer in the metal wire process using copper and can also improve the orientation and binding force of the Cu CVD seed layer.

In accordance with an embodiment of the present invention, there is provided a method for forming damascene type of metal wire in a semiconductor device, the method comprising the steps of forming an interlayer-insulating layer over an entire structure including a predetermined lower conductive layer; patterning the interlayer-insulating layer to form a contact hole and trench for line; depositing a first copper layer along with the surface of the entire structure by physical vapor deposition; depositing a second copper layer for seed layer along with the surface of the first copper by chemical vapor deposition; forming a third copper layer for main wire by electric plating; and recessing the third, second and first copper layers until the interlayer insulating layer is exposed.

The present invention is to deposit a copper thin layer by physical vapor deposition, to form a seed layer by chemical vapor deposition, and then to deposit copper for main wire by electric plating, wherein the copper layer deposited by physical vapor deposition can increase the orientation and binding force of copper layer deposited later by CVD. The step coverage of the seed layer can be also improved due to chemical vapor deposition.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENTS

The invention will be illustrated in detail by the following preferred embodiment with reference to the accompanying drawings.

Figure 1:
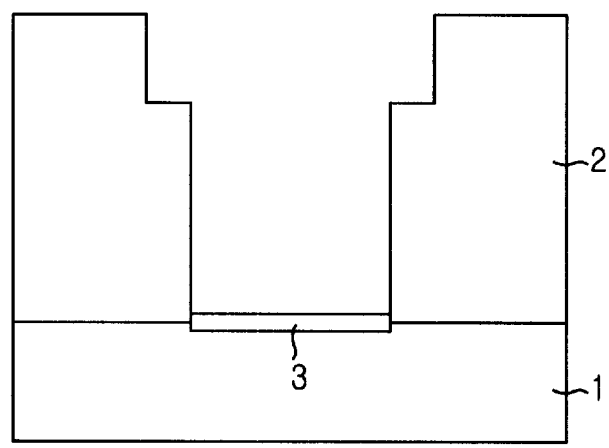
FIGS. 1 through 5 show the processes for forming damascene type of metal wire in accordance with one embodiment of the present invention.

Referring to FIG. 1, an interlayer-insulating layer 2 on a lower conductive layer 1 is etched to form a contact hole and trench for line. The lower conductive layer 1 is exposed through the contact hole and trench after etching. Natural oxide of metal oxide 3 is formed on the surface of the exposed lower conductive layer 1.

Figure 2:
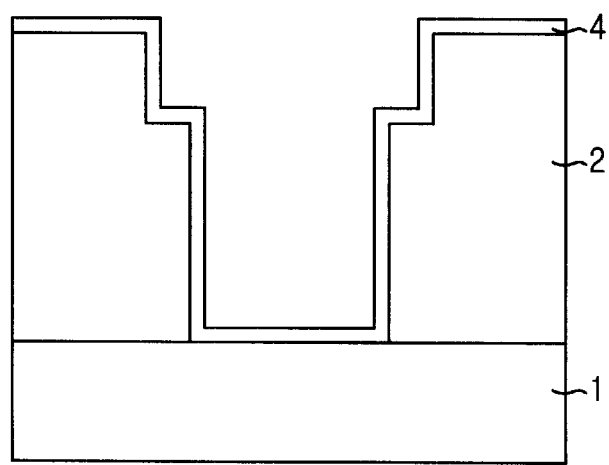

Referring to FIG. 2, the natural oxide 3 on the surface of the lower conductive layer 1 is then removed by using mixed gases of argon gas and hydrogen or helium gas under vacuum pressure. Then, a barrier metal layer 4 is deposited along with the surface of entire structure without breakage of vacuum by physical vapor deposition.

Figure 3:
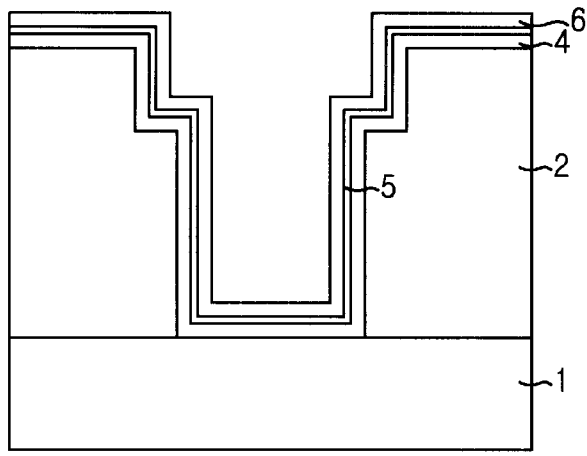

Continuously, as shown in FIG. 3, a copper layer 5 of 200 Å or less is deposited along the surface of the barrier metal layer by physical vapor deposition. A copper seed layer 6 is then deposited along the surface of the copper layer 5 by chemical vapor deposition. At this time, the copper seed layer 6 is formed with step coverage of about 100 to 200 Å on the sidewall of the contact hole.

Figure 4:
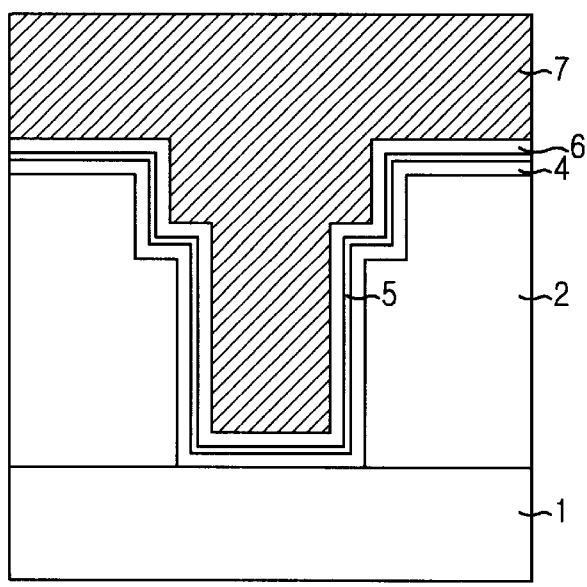

Consequently, referring to FIG. 4, a copper layer 7 for main wire is deposited over the entire structure by using electric plating method. Thermal treatment is then performed at a temperature of 25 to 350° C. At this time, the thermal treatment is performed under vacuum, hydrogen, hydrogen/nitrogen or hydrogen/argon atmosphere.

Figure 5:
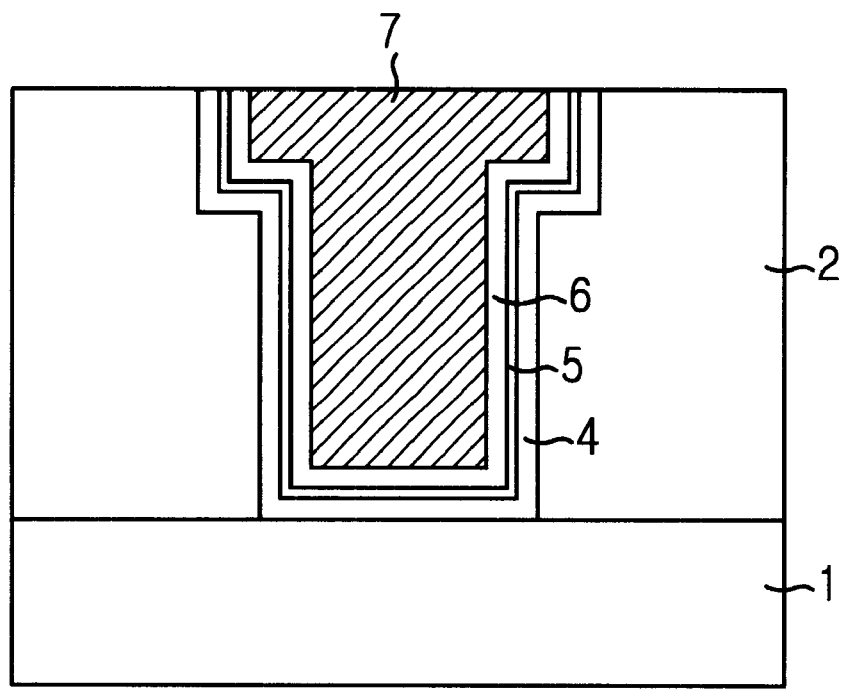

Next, referring to FIG. 5, chemical mechanical polishing is performed to abrade the copper layer 7 for main wire, copper seed layer 6, copper layer 5 and barrier metal layer 4 until the interlayer-insulating layer 2 is exposed.

In the completed structure, physical vapor deposition cannot give the copper layer 5 sufficient step coverage at the bottom of contact hole, but can give it sufficient step coverage at the other portions. Therefore, the copper layer 5 by physical vapor deposition can allow the copper seed layer 6 by chemical vapor deposition and the copper layer 7 by electric plating to obtain good orientation and binding force. The copper seed layer 6 can be also deposited with good and uniform step coverage within the contact hole and trench due to chemical vapor deposition. Accordingly, the present invention can prevent the formation of voids within the contact hole and trench when the copper layer 7 for main wire is deposited by electric plating.

While the present invention has been described with respect to a certain preferred embodiment only, other modifications and variations may be made without departing from the spirit and scope of the present invention as set forth in the following claims.

For example, the present invention may include the case that the copper layer by chemical vapor deposition is formed with sufficient thickness within the contact hole and trench to some extent or less which the contact hole and trench are almost buried with the copper layer by chemical vapor deposition.

What is claimed is:

1. A method for forming a damascene type metal wiring in a semiconductor device, the method comprising the steps of:

forming an entire structure including an interlayer insulating layer over a predetermined lower conductive layer;

patterning the interlayer insulating layer to form a contact hole and a trench;

depositing a first copper layer along the surface of the entire structure by physical vapor deposition;

depositing a second copper layer for a seed layer along the surface of the first copper layer by chemical vapor deposition;

forming a third copper layer for a main wire of the metal wiring by electric plating; and, polishing the third, second and first copper layers until the interlayer insulating layer is exposed.

2. The method according to claim 1, wherein the first copper layer is deposited with a thickness of 200 Å or less.

3. The method according to claim 1, wherein the second copper layer is deposited with a thickness of 100 to 200 Å on the sidewall of the contact hole.

4. The method according to claim 1, further comprising the step of thermal treating of the metal wiring at a temperature of 25 to 350° C. after the step of polishing.

5. The method according to claim 4, wherein the thermal treating is performed under an atmosphere selected from the group consisting of a vacuum, hydrogen, hydrogen/nitrogen, and hydrogen/argon atmospheres.

6. The method according to claim 1, further comprising the steps of removing a natural oxide formed on the surface of the lower conductive layer exposed with patterning the contact hole and trench, and then forming a barrier metal layer along the surface of the patterned interlayer insulating layer and an exposed portion of the lower conductive layer.

7. The method according to claim 6, wherein the removal of the natural oxide is performed with mixed gases of argon gas and hydrogen or helium gas.

8. The method according to claim 1, wherein the polishing is performed by a chemical mechanical polishing technique.

9. A method of forming a damascene type metal wiring in a semiconductor device, the method comprising the steps of:

forming an entire structure including an interlayer insulating layer over a predetermined lower conductive layer;

patterning the interlayer insulating layer to form a contact hole and a trench;

depositing a first copper layer along the surface of the entire structure by physical vapor deposition;

depositing a second copper layer on the surface of the first copper layer by chemical vapor deposition, wherein the contact hole and trench are buried with the second copper layer;

forming a third copper layer by electric plating; and, polishing the third, second, and first copper layers until the interlayer insulating layer is exposed.

10. The method according to claim 9, wherein the first copper layer is deposited with a thickness of 200 Å or less.

11. The method according to claim 9, further comprising the step of thermal treating of the metal wiring at a temperature of 25 to 350° C. after the step of polishing.

12. The method according to claim 11, wherein the thermal treating is performed under an atmosphere selected from the group consisting of vacuum, hydrogen, hydrogen/nitrogen, and hydrogen/argon atmospheres.

13. The method according to claim 9, further comprising the steps of removing a natural oxide formed on the surface of the lower conductive layer exposed with patterning the contact hole and trench, and then forming a barrier metal layer along the surface of the patterned interlayer insulating layer and an exposed portion of the lower conductive layer.

14. The method according to claim 13, wherein the removal of the natural oxide is performed with mixed gases of argon gas and hydrogen or helium gas.

15. The method according to claim 9, wherein the polishing is performed by a chemical mechanical polishing technique.

* * * * *